United States Patent
Fukui et al.

(10) Patent No.: US 6,809,409 B2
(45) Date of Patent: Oct. 26, 2004

(54) LEAD FRAME AND SEMICONDUCTOR DEVICE MADE USING THE LEAD FRAME

(75) Inventors: Atsushi Fukui, Fukuoka (JP); Keiichi Tsujimoto, Fukuoka (JP)

(73) Assignee: Mitsui High-tec, Inc. (JP)

( * ) Notice: Subject to any disclaimer, the term of this patent is extended or adjusted under 35 U.S.C. 154(b) by 0 days.

(21) Appl. No.: 10/324,892

(22) Filed: Dec. 20, 2002

(65) Prior Publication Data

US 2003/0122225 A1 Jul. 3, 2003

(30) Foreign Application Priority Data

Dec. 27, 2001 (JP) .................................... P. 2001-398158

(51) Int. Cl.$^7$ ............................................. H01L 23/495
(52) U.S. Cl. ........................................ 257/676; 257/666
(58) Field of Search ................................ 257/666, 676, 257/730, 731, 732, 734

(56) References Cited

U.S. PATENT DOCUMENTS

| | | | |
|---|---|---|---|
| 5,864,174 A | * | 1/1999 | Yamada et al. |
| 6,025,640 A | * | 2/2000 | Yagi et al. |
| 6,271,581 B2 | * | 8/2001 | Huang et al. |
| 6,396,139 B1 | * | 5/2002 | Huang |
| 6,476,469 B2 | * | 11/2002 | Huang et al. |
| 6,501,156 B1 | * | 12/2002 | Nakanishi et al. |
| 6,580,161 B2 | * | 6/2003 | Kobayakawa |

FOREIGN PATENT DOCUMENTS

| JP | 9-82741 | 3/1997 |
|---|---|---|
| JP | 2000-91488 | 3/2000 |
| JP | 2003-110081 | 4/2003 |

* cited by examiner

Primary Examiner—S. V. Clark
(74) Attorney, Agent, or Firm—Wood, Phillips, Katz, Clark & Mortimer

(57) ABSTRACT

A lead frame having a body with oppositely facing, substantially planar, first and second surfaces respectively facing in first and second directions and residing in first and second substantially parallel reference planes. The body defines a support for a semiconductor chip and a plurality of leads. The support has a third surface facing in the first direction to which a semiconductor chip can be mounted, and a fourth surface facing in the second direction. At least a part of the fourth surface is spaced from the second reference plane towards the first reference plane.

50 Claims, 9 Drawing Sheets

LEAD FRAME AND SEMICONDUCTOR DEVICE MADE USING THE LEAD FRAME

BACKGROUND OF THE INVENTION

1. Field of the Invention

This invention relates to semiconductor devices incorporating a lead frame defining a support for a semiconductor chip and a plurality of leads.

2. Background Art

There has been a trend in recent years to minimize the size of semiconductor devices. This makes possible the compact and lightweight construction of electronic appliances, and the like, incorporating the semiconductor devices. As examples of appliances, for which size and weight are key design considerations, are portable telephones, PDA devices, as well as myriad other portable electronic appliances used in many diverse environments and for different purposes. Various designs of semiconductor devices have evolved over the years to achieve the ends of miniaturization, thickness reduction and weight reduction. These devices are commonly referred to as TBGA that use a lead frame and TAB (tape automated bonding) tape, PBGA, and CSP (chip size package) that use flexible printed circuit boards. Options include wafer-scale CSP, which is the same size as the chip, and CSP, which is somewhat larger than the chip.

Of these devices, particular interest has been paid to semiconductor devices of the type wherein leads are exposed at a flat face within the confines of a resin sealed package, rather than on the edges thereof. Exemplary packages are those referred to as SON (small outline non-leaded package) and QFN (quad flat non-leaded package).

Figure 15:
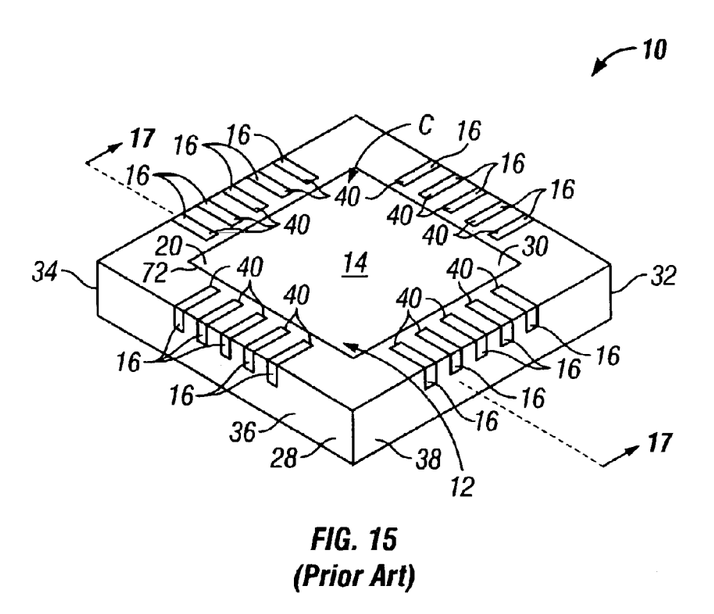
FIG. 15 is a perspective view of a conventional semiconductor device.
Figure 16:
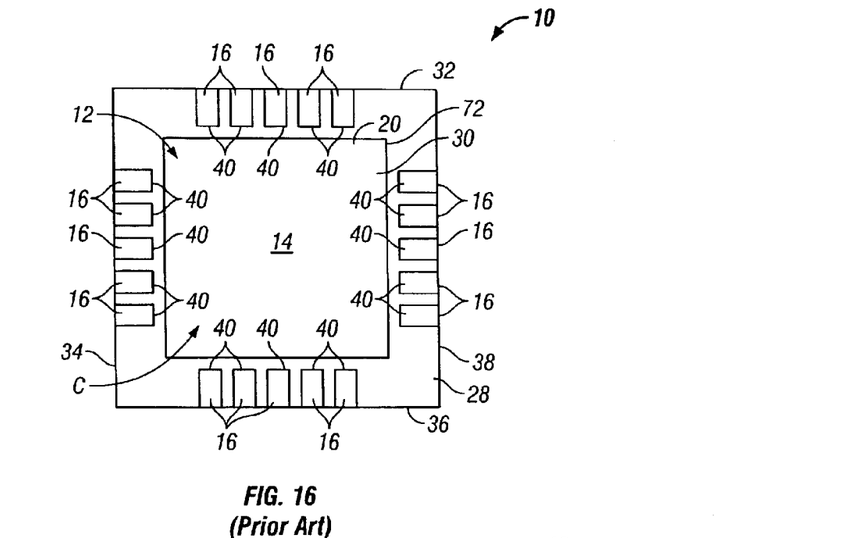
FIG. 16 is a plan view of the semiconductor device of FIG. 15.
Figure 17:
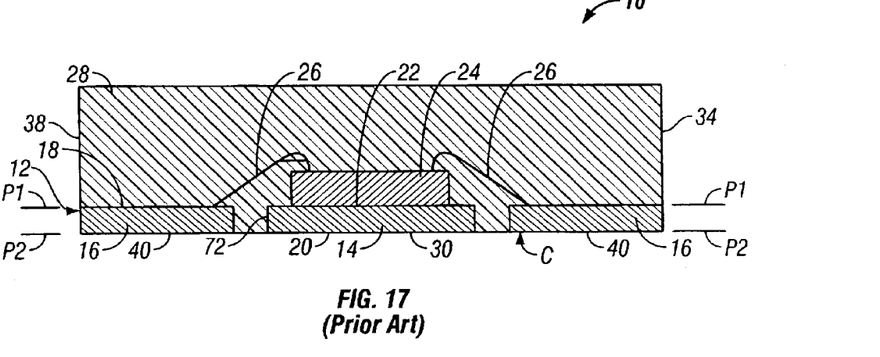
FIG. 17 is an inverted, cross-sectional view of the semiconductor device taken along line 17—17 of FIG. 15.

An exemplary, conventional, QFN-type semiconductor device is shown at 10 in FIGS. 15–17. The semiconductor device 10 has a unit lead frame 12 which defines a support 14 and a plurality of leads 16 spaced around the support 14. The lead frame 12 has a first planar surface 18, facing in a first direction, and a second planar surface 20, facing oppositely to the first surface 18. The first and second surfaces 18, 20 reside respectively in spaced, parallel, reference planes P1, P2. The support 14 has a surface portion 22 upon which a semiconductor device 24 is mounted. The semiconductor device 24 is electrically connected to the leads 16 through conductive wires 26. The support 14, leads 16, semiconductor device 24, and conductive wires 26 are embedded in a sealing resin 28. A surface portion 30 on the support 14, facing oppositely to the surface portion 22, is exposed at the second reference plane P2.

With this construction, the leads 16 do not protrude from straight edges 32, 34, 36, 38 which cooperatively bound the polygonal shape of the semiconductor device 10. The leads 16 have surface portions 40 which are coplanar with the surface portion 30 on the support 14 and are coplanar with, and exposed at, the reference plane P2. This accounts for an overall compact arrangement with flat mounting locations.

Figure 23:
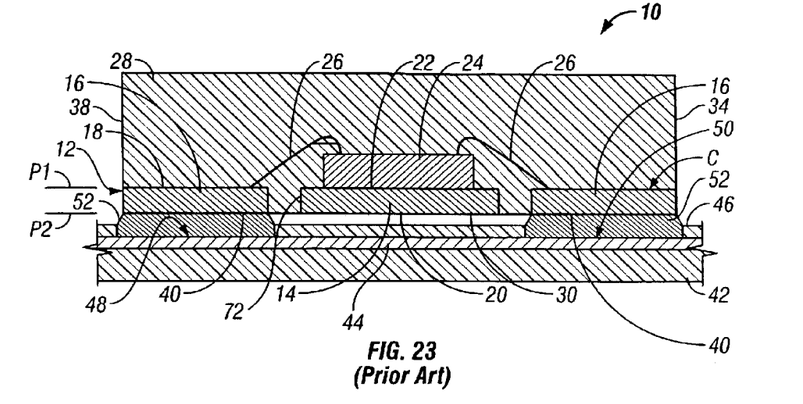
FIG. 23 is a cross-sectional view of the semiconductor device in FIGS. 17 and 22 operatively connected with a printed circuit board.

FIG. 23 shows the semiconductor device 10 mounted upon a printed circuit board 42. The printed circuit board 42 has a circuit pattern 44 thereon coated with a resist layer 46. The resist layer 46 provides an insulating barrier in those regions which do not need to be exposed for electrical connection, as to the leads 16. First portions 48, 50 of the circuit pattern 44 exposed through the resist layer 46 are electrically connected to the leads 16 through solder 52.

Figure 24:
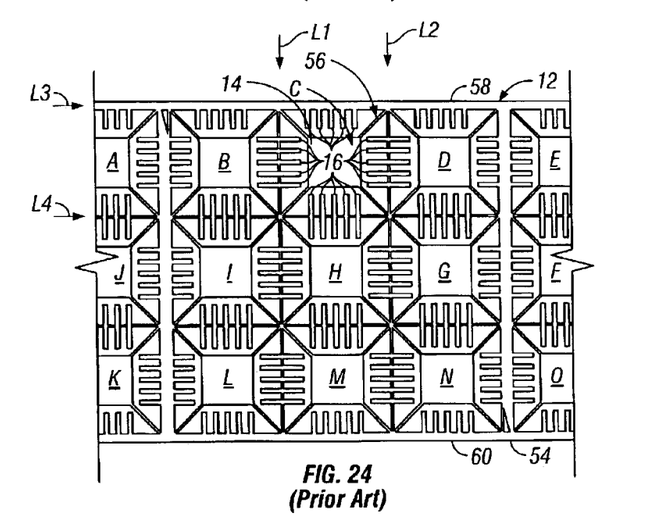
FIG. 24 is a reduced, fragmentary, plan view of a lead frame, including a matrix of unit lead frames, useable to form the semiconductor device in FIGS. 17, 22 and 23.

The semiconductor device 10 may be made by a MAP (mold array package) process. With this process, the lead frame 12 has a configuration as shown in FIG. 24. The lead frame 12 consists of a sheet 54 of conductive material that is processed to produce a matrix pattern of unit lead frames A, B, C, D, E, F, G, H, I, J, K, L, M, N, O. Each of the unit lead frames (A–O) has the same construction as the exemplary lead frame at C, shown in detail in FIGS. 15–17 and 23. Each unit lead frame A–O consists of a support 14 with surrounding leads 16 interconnected and maintained in an operative relationship by a tie bar network at 56. Side rails 58, 60 are used to controllably reposition the sheet 54. The pattern of the supports 14, leads 16, and tie bar network 56 can be made through an etching process using a mask with a resist pattern with these elements thereon, or by other processes known to those skilled in the art.

The steps involved in manufacturing the semiconductor devices 10 from the lead frame 12, using a conventional process, will now be described with respect to FIGS. 18–22.

Figure 18:
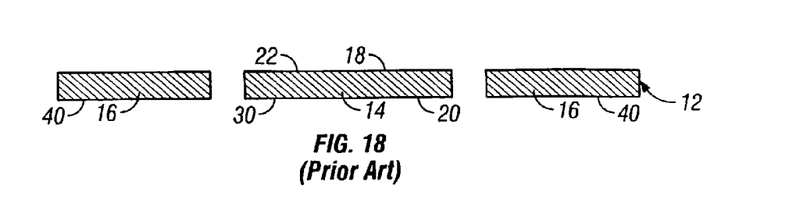
FIG. 18 shows a unit lead frame consisting of a support and a plurality of leads.
Figure 19:
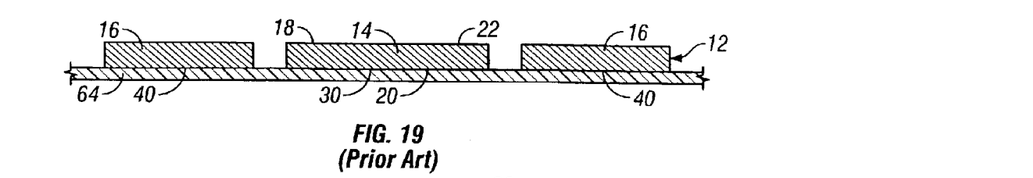
FIG. 19 shows a film layer applied to one side of the lead frame.
Figure 20:
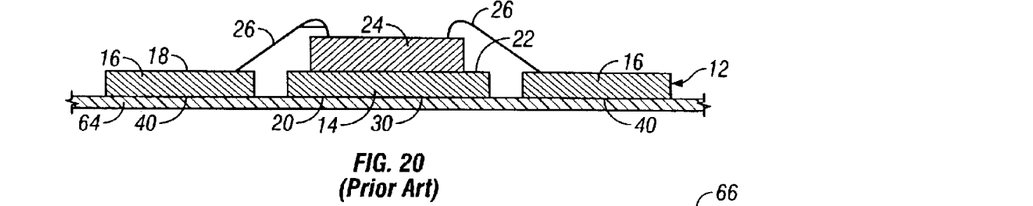
FIG. 20 shows a semiconductor chip applied to the support and electrically wired to the leads.

A film layer 64, as show in FIG. 19, is applied to the second surface 20 of the lead frame in FIG. 18 to control the flow of the sealing resin 28 at the second surface 20. A shown in FIG. 20, the semiconductor device 24 is applied to the surface portion 22 of the support 14 and is electrically connected to the leads 16 through the wires 26.

Figure 21:
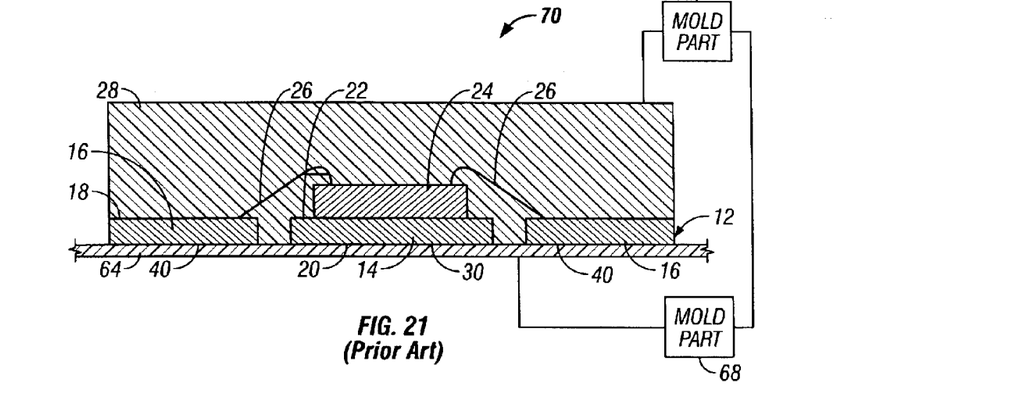
FIG. 21 shows a sealing resin applied over one side of the structure in FIG. 20 to produce a preassembly.
Figure 22:
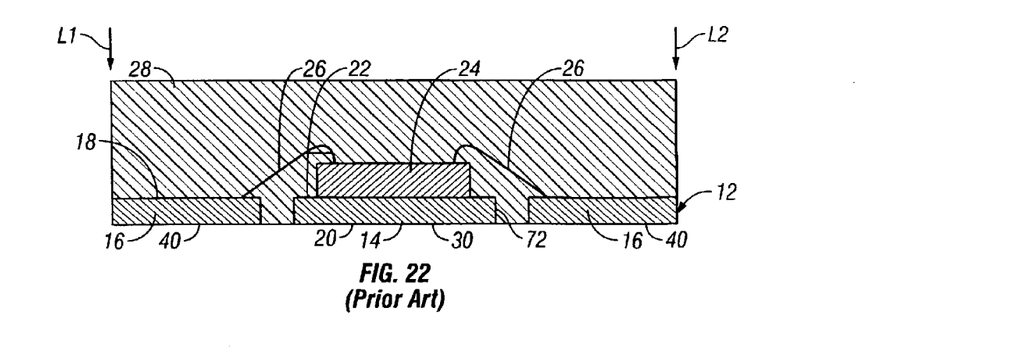
FIG. 22 shows the preassembly cut to produce a single semiconductor device with the film layer removed.

As shown in FIG. 21, the sealing resin 28 is then applied using cooperating mold parts 66, 68 so that the semiconductor chip 24 and wires 26 are fully encased within the sealing resin 28, resulting in the formation of a preassembly at 70.

Once the sealing resin 28 is cured, the preassembly 70 is strategically cut to define individual semiconductor devices 10. To complete the exemplary semiconductor device 10, made from the lead frame C, the preassembly 70 is cut along lines L1, L2, shown in FIGS. 22 and 24, and along orthogonal lines L3, L4, shown in FIG. 24. The cutting can be carried out in a conventional process, as by using a cutting blade.

The conventional semiconductor device 10, of the type shown in FIGS. 15–24, may have a number of problems that are inherent to the design. First of all, there is a tendency of the sealing resin 28 to peel at the interface between the peripheral edge 72 of the support 14 and the sealing resin 28. This interface may also be the cause of warping of the semiconductor device package.

Another problem with the conventional design described herein is that the relatively thin resist layer 46, as shown in FIG. 23, is the only insulating structure between the support 14 and the circuit pattern 44 on the printed circuit board 42. Thus, there is a risk that the support 14 may detrimentally make electrical contact with the circuit pattern 44.

Another drawback with the conventional design is the requirement for the film layer 64, which is applied after the formation of the lead frame 12. The film layer 64 is applied before the attachment of the semiconductor chips 24, the conductive wires 26, and the molding of the sealing resin 28. During these processes, the surface portion 30 of the support 14 is supported upon, and acted against by, a heater plate. This may make more difficult the removal of the film layer 64 from the support 14 required to complete the semiconductor device 10.

SUMMARY OF THE INVENTION

In one form, the invention is directed to a lead frame having a body with oppositely facing, substantially planar, first and second surfaces respectively facing in first and second directions and residing in first and second substantially parallel reference planes. The body defines a support for a semiconductor chip and a plurality of leads. The support has a third surface facing in the first direction, to which a semiconductor chip can be mounted, and a fourth surface facing in the second direction. At least a part of the fourth surface is spaced from the second reference plane towards the first reference plane.

In one form, at least a part of the fourth surface is planar and resides in a fourth reference plane that is substantially parallel to the first and second reference planes.

A first discrete projection may project from the fourth surface in the second direction.

In one form, the first discrete projection is formed as one piece with at least a part of the support. Alternatively, the first discrete projection may be formed separately from the support and secured to the support.

In one form, the first projection may be secured to the support through an insulating member.

In one form, the first discrete projection has a free end and the free end resides substantially at the second reference plane.

In one form, the first discrete projection has a length, and a cross-sectional configuration transverse to its length that is substantially round.

The first discrete projection may have a cylindrical shape.

In one form the fourth surface of the support has a polygonal shape with a center and the first discrete projection resides substantially at the center of the polygonal shape.

In one form, there is at least one discrete projection in addition to the first discrete projection projecting from the fourth surface in the second direction.

The at least one discrete projection in addition to the first discrete projection may consist of a plurality of discrete projections which, in conjunction with the first discrete projection, extend along a substantially straight line on the fourth surface.

In one form, the fourth surface has a polygonal shape with a center and a plurality of corners and the substantially straight line extends between two of the plurality of corners and across the center of the fourth surface.

In one form, the at least one discrete projection in addition to the first discrete projection consists of a first plurality of discrete projections which extend around the first discrete projection.

In one form, the at least one discrete projection in addition to the first discrete projection consists of a plurality of discrete projections which, in conjunction with the first discrete projection, extend along first and second crossing lines on the fourth surface.

In one form, the first discrete projection and the at least one discrete projection have a length and cross-sectional configuration with an area transversely to their length and the area of the cross-sectional configuration of the first discrete projection and the at least one projection are different.

In one form, the first plurality of discrete projections extend around the first discrete projection and are each spaced a first distance from the first discrete projection and there is a second plurality of projections in addition to the first discrete projection and first plurality of projections which are spaced from the first discrete projection a distance different than the first distance.

In one form, the second plurality of discrete projections are spaced from the first discrete projection a distance greater than the first distance.

In one form, the plurality of leads have a substantially uniform thickness extending fully between the first and second reference planes.

In one form, the third surface is substantially planar and coincident with the first reference plane.

The invention is further directed to a semiconductor device having a lead frame, a semiconductor chip mounted on the lead frame, and a sealing resin. The lead frame has a body with oppositely facing, substantially planar, first and second surfaces facing respectively in first and second directions and residing in first and second substantially parallel reference planes. The body further has a support with a third surface facing in the first direction and a fourth surface facing in the second direction and a plurality of leads spaced from the support. At least part of the fourth surface is spaced from the second reference plane towards the first reference plane. The semiconductor chip is mounted on the third surface of the support and electrically connected to the leads. A sealing resin embeds the semiconductor chip, support, and leads.

In one form, the sealing resin covers at least a portion of the fourth surface on the support.

The sealing resin may have an exposed surface that is substantially planar and resides substantially in the second reference plane.

The plurality of leads may be exposed at the second reference plane.

The invention contemplates that the semiconductor device may incorporate all the variations of the lead frame described above.

In one form, the free end of the first discrete projection, described above, is exposed at the second reference plane.

The first discrete projection, and plurality of discrete projections described above, may each have a free end that is exposed at the second reference plane.

BRIEF DESCRIPTION OF THE DRAWINGS

FIGS. 6–9 are views as in FIG. 5 and showing sequentially the process for forming inventive semiconductor devices, as in FIG. 9, incorporating the unit lead frame in FIG. 5, wherein.

FIGS. 18–22 are views as in FIG. 17 and showing sequentially the process for forming the semiconductor device in FIG. 17, wherein.

DETAILED DESCRIPTION OF THE DRAWINGS

In FIGS. 1–3 and 9, one form of semiconductor device, made according to the present invention, is shown at 80. The semiconductor device 80 incorporates a unit lead frame 82 that may be one in a matrix of unit lead frames 84, 86, 88, that are interconnected with each other and side rails 90 (one shown) through a tie bar network 92 to produce a lead frame 94 similar to the conventional lead frame 12 shown in FIG. 24.

Figure 3:
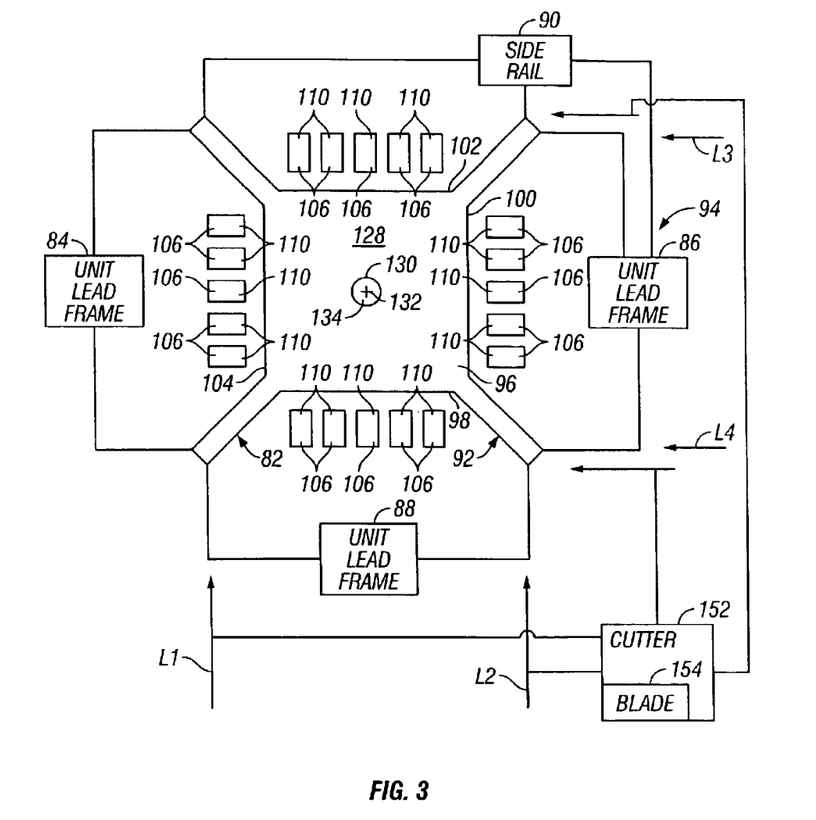
FIG. 3 is a partially schematic plan view of a lead frame showing details of a unit lead frame that is incorporated into the semiconductor device in FIGS. 1 and 2.

Each unit lead frame, as described with respect to exemplary unit lead frame 82, consists of a support 96, which is polygonally shaped, and in this case a square shape bounded by four straight edges 98, 100, 102, 104. The unit lead frame 82 further has rectangular leads 106, which are located adjacent to, and spaced from, each edge 98, 100, 102, 104. In this embodiment, five leads 106 are provided at each edge 98, 100, 102, 104. However, the shape and number of the leads 106 is not critical to the present invention. The tie bar network 92 maintains the leads 106 in an operative relationship with each other and the support 96.

The leads 106 have a uniform thickness between a first, generally planar surface 108, facing in a first direction, and a second, generally planar surface 110, facing oppositely thereto and in a second direction. The surfaces 108, 110 reside in spaced reference planes P1, P2 (FIG. 9) which are substantially parallel to each other.

Figure 9:
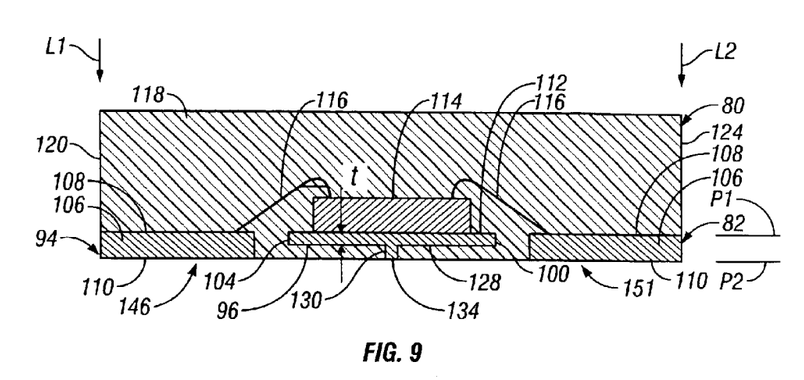
FIG. 9 showing the preassembly cut to produce a single semiconductor device with the film layer removed.

The support 96 has a planar surface 112 facing in the first direction and in substantially coplanar relationship with the reference plane P1. A semiconductor chip 114 is mounted upon the support surface 112. Electrical conductors, in the form of wires 116, electrically connect the semiconductor chip 114 to the leads 106.

Figure 1:
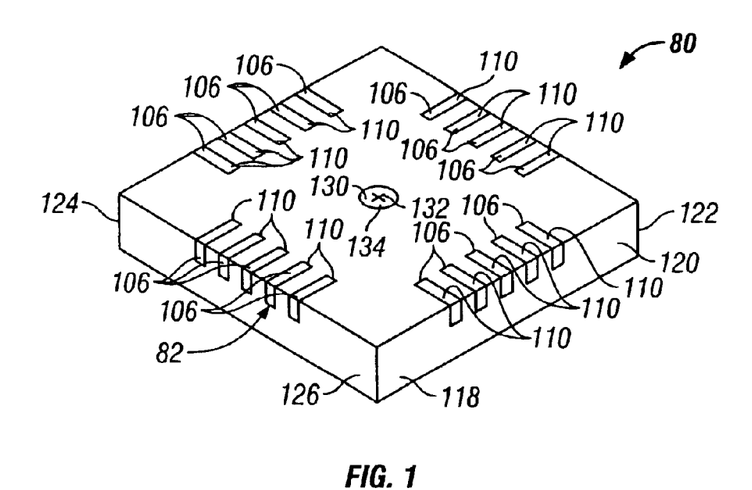
FIG. 1 is a perspective view of a semiconductor device, made according to the present invention, including a unit lead frame having a support and a plurality of leads and a projection on the support.
Figure 2:
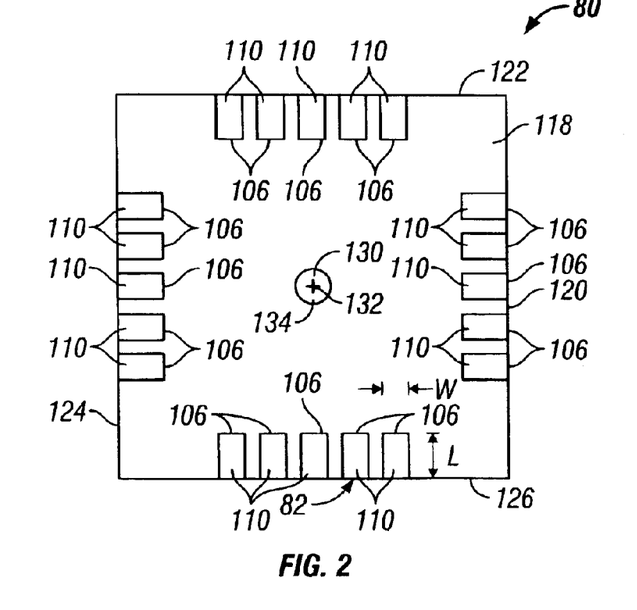
FIG. 2 is a plan view of the semiconductor device in FIG. 1.

A sealing resin 118 encases the support 96, leads 106, semiconductor chip 114, and wires 116 and is molded, as described below, to dictate the squared peripheral shape of the semiconductor device 80. In this particular embodiment, the semiconductor device 80 is square and bounded by four edges 120, 122, 124, 126, which are straight and extend generally parallel to the support edges 98, 100, 102, 104.

The support 96 has a surface 128 that is spaced from the reference plane P2 towards the reference plane P1 in FIG. 9. The surface 128 in this embodiment is substantially planar and substantially parallel to the reference planes P1, P2, and in this embodiment residing substantially midway therebetween.

The support 96 has a discrete projection 130 projecting from the surface 128 of the support 96 in the second direction. In this embodiment, the projection 130 has a cylindrical shape with a length and a central axis 132 coinciding with the center of the surface 128. The projection 130 has a free end 134 that is substantially flat and coplanar with the reference plane P2 and the lead surfaces 110. Once the sealing resin 118 is formed, the sealing resin 118 covers the support surface 128 so that only the free end surface 134 of the projection 130 is exposed at the reference plane P2. It is not necessary that the free end surface 134 actually be exposed, however.

In one form, the lead frame 94 is formed by etching a 0.2 mm thick copper or iron nickel material. In an exemplary construction, the leads 106, shown in FIG. 2, have a length L on the order 0.42 mm and a width W on the order of 0.23 mm. The support 96 has a thickness t (FIG. 9) in the region around the projection 130 that is on the order of 0.1 mm. The projection 130 has a diameter on the order 0.2 mm. The above dimensions are only exemplary and not critical to the invention. Similarly, the shapes shown, as for the leads, are not critical, and could vary significantly from what is shown.

Figure 4:
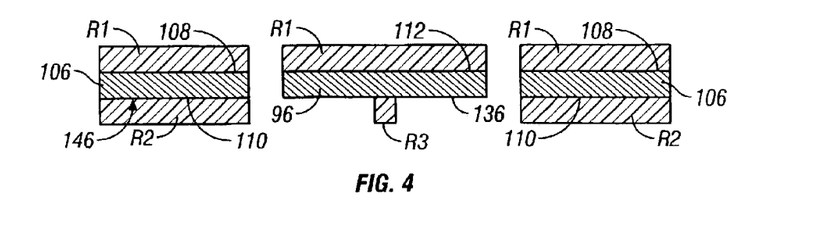
FIG. 4 is a side elevation view of a unit lead frame with resist elements applied thereto to facilitate formation of a support with a projection, according to the invention, that is one piece with the support.
Figure 5:
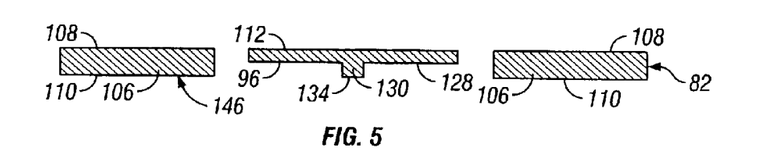
FIG. 5 is a view as in FIG. 4 with the projection formed on the support and the resist elements removed from the lead frame.

The lead frame 94 up to the point that the projection 130 is formed, may be constructed in conventional fashion by processing a sheet in a manner well known to those skilled in the art, i.e. by etching as described for the lead frame 12 in FIG. 24, or by half-etching followed by press molding. As shown in FIG. 4, to form the support 96 according to the invention, resist patterns R1 are applied to the lead frame surface 112. Resist patterns R2 are applied to the opposite oppositely facing lead surfaces 108, 110 and the support surface 112. A micro-resist pattern R3 is applied to a surface portion 136 on the support 96 at the intended location of the projection 130. This surface 136 is initially coplanar with the lead surfaces 110. With the resist patterns R1, R2, and R3 in place, the etching process is performed. The resulting unit lead frame 82, with the resist patterns R1, R2, and R3 removed, is shown in FIG. 5. The etching reduces the thickness of the support 96 around the resist pattern R3 from that shown in FIG. 4 to that shown in FIG. 5 so that the discrete projection 130 is defined in the center of the support 96.

Figure 6:
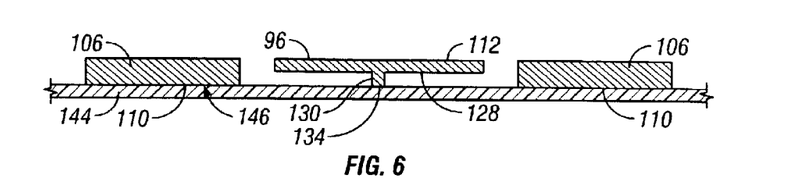
FIG. 6 shows a film layer applied to one side of the unit lead frame of FIG. 5.

The next step in the process is shown in FIG. 6, wherein a film layer, in the form of a polyimide tape 144, is applied at the side 146 of the unit lead frame 82 so as to be adhered to the lead surfaces 110 and the free end surface 134 on the projection 130.

Figure 7:
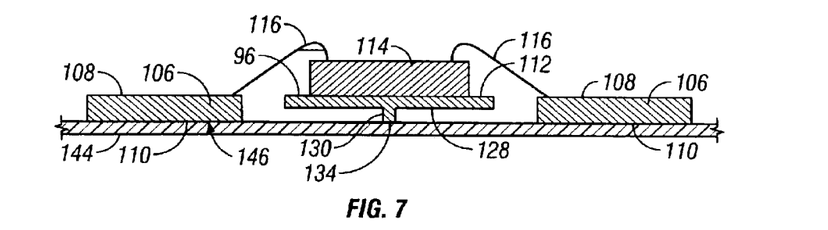
FIG. 7 shows a semiconductor chip applied to the support in FIG. 6 and electrically wired to the leads.

As shown in FIG. 7, the semiconductor chip 114 is then bonded to the support surface 112. The wires 116 are then attached to electrically connect between the semiconductor chip 114 and the leads 106.

Figure 8:
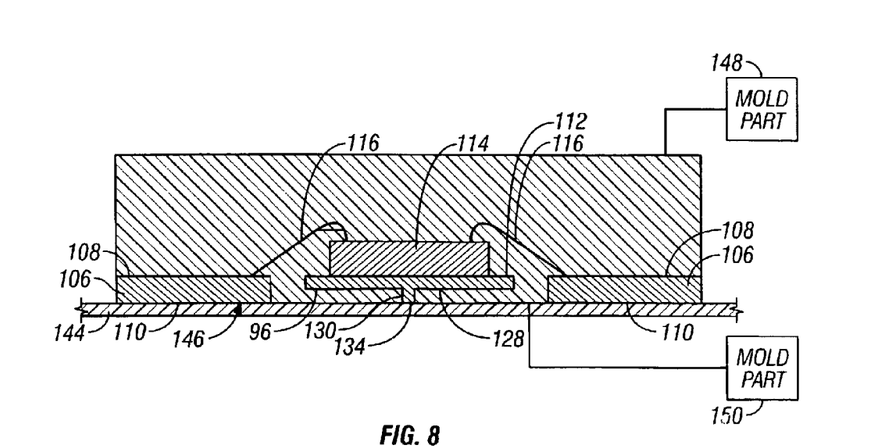
FIG. 8 shows a sealing resin applied over one side of the structure in FIG. 7 to produce a preassembly.

As shown in FIG. 8, the structure in FIG. 7 is then placed between cooperating mold parts 148, 150 defining a cavity into which the sealing resin 118 is poured. The mold parts 148, 150 can be made so as to individually pre-form the sealing resin 118 in a desired end shape around each unit lead frame 82, 84 86, 88. Alternatively, the mold parts 148, 150 are configured so that a uniform thickness of the sealing resin 118 is applied over the matrix of unit lead frames 82, 84, 86, 88 on the lead frame 94 to complete a preassembly 151. In the latter case, the semiconductor devices 80 are separated from each other and the side rails 90 by cutting the preassembly 151 along lines L1, L2 and orthogonal lines L3 and L4 to thereby define the edges 120, 122, 124, 126. The film layer 144 is preferably removed before the cutting takes place. Cutting may be performed by a conventional type cutter 152 having a rotary blade 154.

As can be seen particularly in FIGS. 1, 2 and 9, the sealing resin 118 substantially fully surrounds the support 96, with the exception of the region at which the projection 130 is located, so that there is a positive bonding of the resin 118 to the support 96. As a result, the likelihood of resin peeling from the support 96 at its edges 98, 100, 102, 104 is minimal. The likelihood of warpage of the semiconductor device 80 is also reduced compared to conventional semiconductor devices. This improved bonding between the sealing resin 118 and support 96 enhances the integrity of the semiconductor device 80 without changing the contact area of the leads 106 and without requiring a change in the dimension of the support 96. That is, improved quality can be realized without increasing the overall size of the semiconductor device 80. At the same time, the resin 118 between the support surface 128 and the reference plane P2 provides an insulating layer which reduces the likelihood of inadvertent electrical contact between the support 96 and an associated circuit pattern 44 on a printed circuit board 42, as shown in FIG. 23, to which the semiconductor device 80 is operatively connected.

Figure 10:
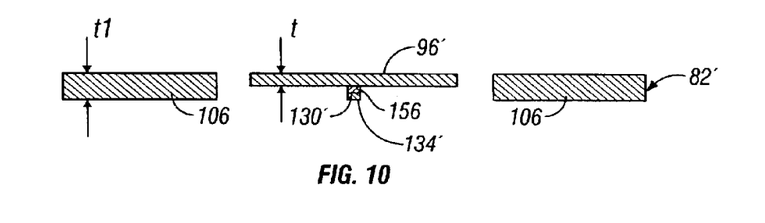
FIG. 10 is a view as in FIG. 5 of a modified form of lead frame, according to the present invention, wherein a projection on the support for the semiconductor chip is formed as a separate element and connected to the support through an intermediate insulating member.

A modified form of support, according to the present invention, is shown in FIG. 10 at 96' on a lead frame 82'. In this embodiment, a projection 130' is separately attached to the support 96' through an insulating adhesive member/layer 156. The support 96' has a reduced thickness t compared to the thickness t1 of the leads 106, similar to the support 96, previously described.

The insulating layer 156 results in the support 96' being fully electrically insulated from any associated circuit pattern 44 on a printed circuit board 42, to which a semiconductor device incorporating the lead frame 82', is electrically connected. Thus, even if the resist layer 46 on the printed circuit board is compromised, it would not result in an inadvertent electrical contact between the support 96' and the surface pattern 44 through the projection 130'. Alternatively, oxide film forming, or other insulating processing, can be performed on the exposed surface 134' of the projection 130'.

Figure 11:
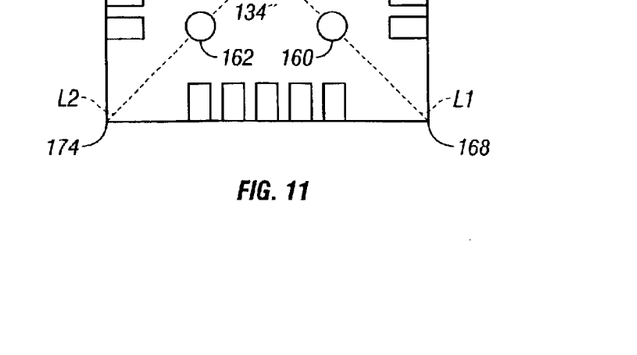
FIG. 11 is a view as in FIG. 2 of a semiconductor device, according to the present invention, and having a support with a plurality of projections.

A further variation of a semiconductor device, according to the present invention, is shown at 80" in FIG. 11. The semiconductor device 80" differs from the previously described semiconductor device 80 only in the configuration of the support 96", corresponding to the support 96. The support 96" includes a central projection 130" and a plurality of additional projections 160, 162, 164, 166 which project to be flush with a flat, free end surface 134" on the projection 130". Each of the projections 160, 162, 164, 166 has the same cylindrical shape as the projection 130". The projections 160, 162, 164, 166 are each equidistantly spaced from the axis 132" of the projection 130". The projections 160, 162, 164, 166 cooperatively bound a square shape. The square shape is arranged so that each of two crossing lines L1, L2 through opposite corners 168, 170; 172, 174 of the semiconductor device 80", pass through the centers of two of the projections 160, 162, 164, 166 and the projection 130".

Figure 12:
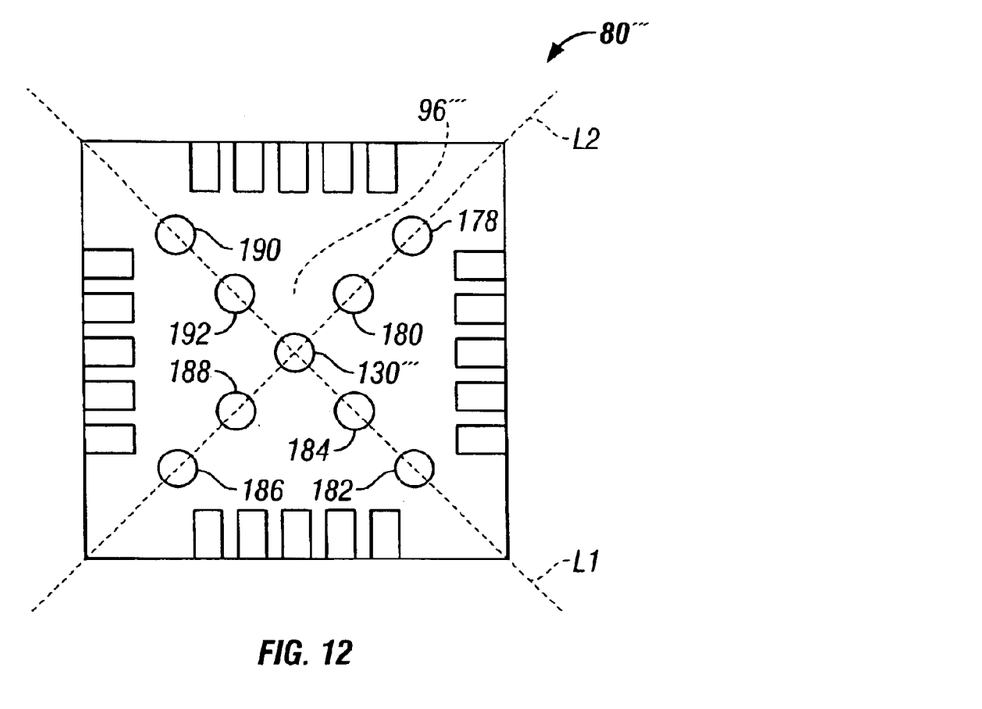
FIG. 12 is a view as in FIG. 11 with a different arrangement of projections, according to the present invention.

In FIG. 12, a further modified form of semiconductor device, according to the present invention is shown at 80'''. Again, the only distinction between the semiconductor device 80''' and the semiconductor device 80 resides in the configuration of the support 96''', which also has a reduced thickness and multiple projections. In this embodiment, there is a central projection 130''', and additional projections 178, 180, 182, 184, 186, 188, 190, 192 arranged along diagonal lines L1, L2, corresponding to the same diagonal lines in FIG. 11. Each diagonal line L1, L2 passes through the centers of four of the projections 178–192 in addition to the central projection 130'''. The projections 180, 184, 188, 192 are equidistantly spaced from the projection 130'''. Similarly, the projections 178, 182, 186, 192 are equidistantly spaced from the projection 130''' and bound a larger square shape.

Figure 13:
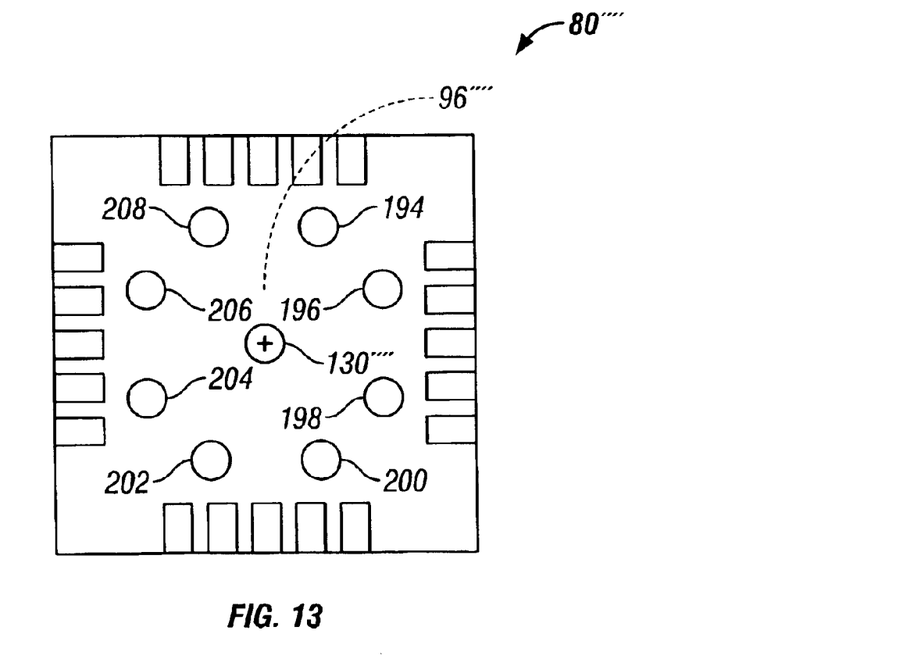
FIG. 13 is a view as in FIG. 11 with a still further different arrangement of projections, according to the present invention.

A further modified form of semiconductor device 80'''' is shown in FIG. 13. The semiconductor device 80'''' differs from the semiconductor device 80 by reason of the configuration of the support 96'''', corresponding to the support 96. The support 96'''' has a reduced thickness and a central projection 130'''' thereon and a plurality, and in this case eight, additional projections 194, 196, 198, 200, 202, 204, 206, 208 spaced equidistantly in a circular array around the central projection 130''''.

Figure 14:
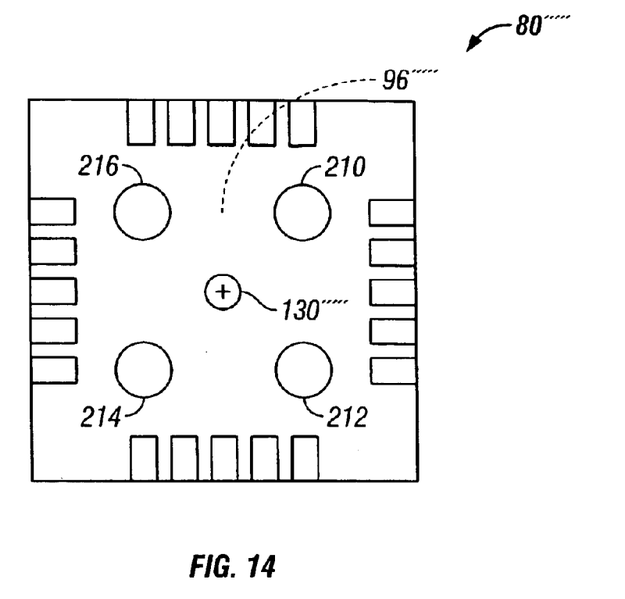
FIG. 14 is a view as in FIG. 11 with yet a further different arrangement of projections, according to the present invention.

In FIG. 14, a still further modified form of semiconductor device, according to the present invention, is shown at 80'''''. The semiconductor device 80''''' differs from the semiconductor device 80 by reason of the difference in the configuration of the support 96''''', corresponding to the support 96. The support 96''''' has a central projection 130''''' and four additional projections 210, 212, 214, 216 spaced from the central projection 130''''' in a square pattern similar to that shown in FIG. 11. However, the projections 210, 212, 214, 216 are shown to have a larger diameter than the central projection 130'''''. The larger diameter may facilitate projection formation by the etching process.

It should be understood that all of the projections 130, 130', 130", 130''', 130'''' 130''''', 160–166, 178–216 could have configurations other than the cylindrical shape shown. Additionally, the particular diameter is not limited to that which is shown. Further, it is not required that these projections have uniform cross-sectional configurations transversely to their length. It is desired, but not necessary, that the free ends of those projections be flat and coplanar with exposed contact surfaces. The projections thus stabilize the support 96, 96', 96", 96''', 96'''', 96''''' during the manufacturing process as the components, i.e. semiconductor chip 114, wires 116, and sealing resin 118 are applied to the lead frame 82. Stabilizing is enhanced by using multiple projections in the various patterns shown.

Figure 25:
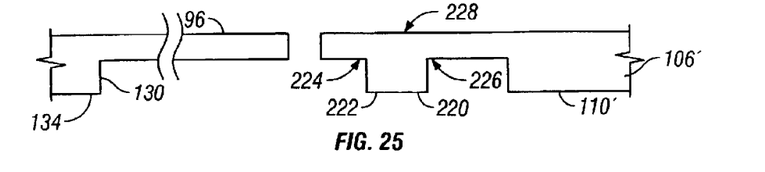
FIG. 25 is an enlarged, fragmentary, elevation view of a modified form of lead frame, according to the present invention, wherein the leads are strategically reduced in thickness.

A further modification according to the invention is shown for a lead 106' in FIG. 25, corresponding to the leads 106, shown in relationship to the support 96. The lead 106' is processed, as by half-etching, so as to define a projection 220 with a planar free end 222 that is coplanar with the free end 134 surface of the projection 130 and the exposed lead surface 110'. Sealing resin 118 flows into two regions 224, 226 to positively embrace the lead end 226 adjacent to the support 96. The thickness of the lead 106' can thus be reduced but is stabilized at the projection 220 against deformation during wire connection so as to afford stability with small transmission losses.

The foregoing disclosure of specific embodiments is intended to be illustrative of the broad concepts comprehended by the invention.

What is claimed is:

1. A lead frame comprising:
    a body with oppositely facing substantially planar first and second surfaces respectively facing in first and second directions and residing in first and second substantially parallel reference planes,
    the body defining a support for a semiconductor chip and a plurality of leads,
    the leads having a surface substantially coinciding with the second reference plane,
    the support having a third surface facing in the first direction to which a semiconductor chip can be mounted and a fourth surface facing in the second direction,
    the third and fourth surfaces substantially coinciding with the first and second reference planes,
    at least a part of the fourth surface being spaced from the second reference plane towards the first reference plane,
    wherein at least a part of the fourth surface is defined by at least five discrete projections which protect in the second direction to the second reference plane.

2. The lead frame according to claim 1 wherein at least a part of the fourth surface is planar and resides in a fourth reference plane that is substantially parallel to the first and second reference planes.

3. The lead frame according to claim 1 wherein at least one of the discrete projections is formed as one piece with at least another part of the support.

4. The lead frame according to claim 1 wherein at least one of the first discrete projections is formed separately from another part of the support and secured to the another part of the support.

5. A lead frame comprising:
    a body with oppositely facing substantially planar first and second surfaces respectively facing in first and second directions and residing in first and second substantially parallel reference planes,
    the body defining a support for a semiconductor chip and a plurality of leads,
    the support having a third surface facing in the first direction to which a semiconductor chip can be mounted and a fourth surface facing in the second direction,
    at least a part of the fourth surface being spaced from the second reference plane towards the first reference plane,
    wherein there is a first discrete projection on the support which projects in the second direction,
    wherein the first discrete projection is formed separately from another part of the support and secured to the another part of the support,
    wherein the first discrete projection is secured to the another part of the support through an insulating member.

6. The lead frame according to claim 1 wherein at least one of the discrete projections has a length and a cross-sectional configuration transverse to the length that is substantially round.

7. The lead frame according to claim 1 wherein at least one of the discrete projections has a cylindrical shape.

8. A lead frame comprising:
    a body with oppositely facing substantially planar first and second surfaces respectively facing in first and second directions and residing in first and second substantially parallel reference planes,
    the body defining a support for a semiconductor chip and a plurality of leads,
    the support having a third surface facing in the first direction to which a semiconductor chip can be mounted and a fourth surface facing in the second direction,
    at least a part of the fourth surface being spaced from the second reference plane towards the first reference plane,
    wherein there is a first discrete projection on the support which projects in the second direction,
    wherein the fourth surface of the support has a polygonal shape with a center and the first discrete projection resides substantially at the center of the polygonal shape.

9. The lead frame according to claim 1 wherein a plurality of the discrete projections extend along a substantially straight line.

10. The lead frame according to claim 1 wherein the five discrete projections include a first discrete projection and a plurality of discrete projections which extend around the first discrete projection.

11. The lead frame according to claim 1 wherein the five discrete projections include a first discrete projection and a plurality of discrete projections which, in conjunction with the first discrete projection, extend along first and second crossing lines.

12. A lead frame comprising:
    a body with oppositely facing substantially planar first and second surfaces respectively facing in first and second directions and residing in first and second substantially parallel reference planes,
    the body defining a support for a semiconductor chip and a plurality of leads,
    the support having a third surface facing in the first direction to which a semiconductor chip can be mounted and a fourth surface facing in the second direction,
    at least a part of the fourth surface being spaced from the second reference plane towards the first reference plane,
    wherein there is a first discrete projection on the support which projects in the second direction,
    wherein there is at least one discrete projection on the support in addition to the first discrete protection that projects from the fourth surface in the second direction,
    wherein the at least one discrete projection in addition to the first discrete projection comprises a plurality of discrete projections which, in conjunction with the first discrete projection, extend along a substantially straight line on the fourth surface, wherein the fourth surface has a polygonal shape with a center and a plurality of corners and the substantially straight line extends between two of the plurality of corners and across the center of the fourth surface.

13. The lead frame according to claim 1 wherein the five discrete projections comprise first and second discrete projections each having a length and a cross-sectional configuration with an area transversely to the length and the areas of the cross-sectional configurations of the first and second discrete projections are different.

14. The lead frame according to claim 10 wherein the plurality of discrete projections extending around the first discrete projection are each spaced a first distance from the first discrete projection and there is a second plurality of projections which are spaced from the first discrete projection distances different than the first distance.

15. The lead frame according to claim 14 wherein the second plurality of discrete projections are spaced from the first discrete projection distances greater than the first distance.

16. The lead frame according to claim 1 wherein the plurality of leads have a substantially uniform thickness extending fully between the first and second reference planes.

17. A semiconductor device comprising:
a lead frame comprising a body with oppositely facing substantially planar first and second surfaces respectively facing in first and second directions and residing in first and second substantially parallel reference planes,
the body further comprising a support with a third surface facing in the first direction and a fourth surface facing in the second direction and a plurality of leads spaced from the support,
the third and fourth surfaces substantially coinciding with the first and second reference planes,
the fourth surface having an area,
at least a part of the fourth surface spaced from the second reference plane towards the first reference plane;
the fourth surface defined in part by a discrete projection which projects in the second direction and defines a portion of the area of the fourth surface that constitutes a small portion of the entire area of the fourth surface;
a semiconductor chip mounted on the third surface of the support and electrically connected to the leads; and
a sealing resin in which the semiconductor chip, support, and leads are embedded.

18. The semiconductor device according to claim 17 wherein the sealing resin covers at least a portion of the fourth surface on the support.

19. The semiconductor device according to claim 17 wherein the sealing resin has an exposed surface that is substantially planar and resides substantially in the second reference plane.

20. The semiconductor device according to claim 17 wherein the plurality of leads are exposed at the second reference plane.

21. The semiconductor device according to claim 17 wherein at least a part of the fourth surface is planar and resides in a fourth reference plane that is substantially parallel to the first and second reference planes.

22. The semiconductor device according to claim 17 wherein there is a first discrete projection on the support which projects in the second direction.

23. The semiconductor device according to claim 23 wherein the first discrete projection has a free end and the free end resides substantially at the second reference plane.

24. The semiconductor device according to claim 22 wherein the first discrete projection has a free end and the free end is exposed at the second reference plane.

25. The semiconductor device according to claim 22 wherein the first discrete projection is formed separately from another part of the support and secured to the another part of the support.

26. A semiconductor device comprising:
a lead frame comprising a body with oppositely facing substantially planar first and second surfaces respectively facing in first and second directions and residing in first and second substantially parallel reference planes,
the body further comprising a support with a third surface facing in the first direction and a fourth surface facing in the second direction and a plurality of leads spaced from the support,
at least a part of the fourth surface spaced from the second reference plane towards the first reference plane;
a semiconductor chip mounted on the third surface of the support and electrically connected to the leads; and
a sealing resin in which the semiconductor chip, support, and leads are embedded,
wherein there is a first discrete projection on the support which projects in the second direction,
wherein the first discrete projection is formed separately from another part of the support and secured to the another part of the support,
wherein the first discrete projection is secured to the another part of the support through an insulating member.

27. The semiconductor device according to claim 22 wherein the first discrete projection has a cylindrical shape.

28. A semiconductor device comprising:
a lead frame comprising a body with oppositely facing substantially planar first and second surfaces respectively facing in first and second directions and residing in first and second substantially parallel reference planes,
the body further comprising a support with a third surface facing in the first direction and a fourth surface facing in the second direction and a plurality of leads spaced from the support,
at least a part of the fourth surface spaced from the second reference plane towards the first reference plane;
a semiconductor chip mounted on the third surface of the support and electrically connected to the leads; and
a sealing resin in which the semiconductor chip, support, and leads are embedded,
wherein there is a first discrete projection on the support which projects in the second direction,
wherein the fourth surface of the support has a polygonal shape with a center and the first discrete projection resides substantially at the center of the polygonal shape.

29. The semiconductor device according to claim 22 wherein there is at least one discrete projection in addition to the first discrete projection on the support that projects in the second direction.

30. The semiconductor device according to claim 29 wherein the at least one discrete projection in addition to the first discrete projection comprises a plurality of discrete projections which, in conjunction with the first discrete projection, extend along a substantially straight line on the fourth surface.

31. The semiconductor device according to claim 29 wherein the at least one discrete projection in addition to the first discrete projection comprises a first plurality of discrete projections which extend around the first discrete projection.

32. The semiconductor device according to claim 29 wherein the at least one discrete projection in addition to the first discrete projection comprises a plurality of discrete projections which, in conjunction with the first discrete projection, extend along first and second crossing lines on the fourth surface.

33. The semiconductor device according to claim 30 wherein the fourth surface has a polygonal shape with a center and a plurality of corners and the substantially straight line extends between two of the plurality of corners and across the center of the fourth surface.

34. The semiconductor device according to claim 29 wherein the first discrete projection and the at least one discrete projection have a length and a cross-sectional configuration with an area transversely to their length and the areas of the cross-sectional configurations of the first discrete projection and the at least one discrete projection are different.

35. The semiconductor device according to claim 31 wherein the first plurality of discrete projections extending around the first discrete projections are each spaced a first distance from the first discrete projection and there is a second plurality of projections in addition to the first discrete projection and first plurality of projection which are spaced from the first discrete projection distances different than the first distance.

36. The semiconductor device according to claim 35 wherein the second plurality of discrete projections are spaced from the first discrete projection distances greater than the first distance.

37. The semiconductor device according to claim 17 wherein the plurality of leads have a substantially uniform thickness extending fully between the first and second reference planes.

38. The semiconductor device according to claim 30 wherein the first discrete projection and the plurality of discrete projections each have a free end that is exposed at the second reference plane.

39. The semiconductor device according to claim 17 wherein the sealing resin is applied to the leads and the third surface of the support.

40. The semiconductor device according to claim 17 wherein the sealing resin substantially fully covers the leads and the third surface of the support.

41. A lead frame comprising:
a body with oppositely facing substantially planar first and second surfaces respectively facing in first and second directions and residing in first and second substantially parallel reference planes,
the body defining a support for a semiconductor chip and a plurality of leads,
the support having a third surface facing in the first direction to which a semiconductor chip can be mounted and a fourth surface facing in the second direction,
the third and fourth surfaces substantially coincident with the first and second reference planes,
at least a part of the fourth surface being spaced from the second reference plane towards the first reference plane,
wherein the support comprises at least three discrete projections which project in the second direction,
the at least three discrete projections extending along a substantially straight line.

42. The lead frame according to claim 41 wherein each of the three discrete projections has an area facing in the second direction and the areas of the three discrete projections have substantially the same shape.

43. A lead frame comprising:
a body with oppositely facing substantially planar first and second surfaces respectively facing in first and second directions and residing in first and second substantially parallel reference planes,
the body defining a support for a semiconductor chip and a plurality of leads,
the support having a third surface facing in the first direction to which a semiconductor chip can be mounted and a fourth surface facing in the second direction,
the third and fourth surfaces substantially coincident with the first and second reference planes,
at least a part of the fourth surface being spaced from the second reference plane towards the first reference plane,
wherein the support comprises a plurality of discrete projections which project in the second direction,
the plurality of projections comprising a first discrete projection and a first plurality of discrete projections that extend around the first discrete projection.

44. The lead frame according to claim 43 wherein each of the discrete projections has an area facing in the second direction and the areas of the discrete projections have substantially the same shape.

45. A lead frame comprising:
a body with oppositely facing substantially planar first and second surfaces respectively facing in first and second directions and residing in first and second substantially parallel reference planes,
the body defining a support for a semiconductor chip and a plurality of leads,
the support having a third surface facing in the first direction to which a semiconductor chip can be mounted and a fourth surface facing in the second direction,
the third and fourth surfaces substantially coincident with the first and second reference planes,
at least a part of the fourth surface being spaced from the second reference plane towards the first reference plane,
wherein the support comprises a plurality of discrete projections which project in the second direction,
the discrete projections have an area facing in the second direction,
the area of first and second of the discrete projections being different.

46. A lead frame comprising:
a body with oppositely facing substantially planar first and second surfaces respectively facing in first and second directions and residing in first and second substantially parallel reference planes,
the body defining a support for a semiconductor chip and a plurality of leads,
the support having a third surface facing in the first direction to which a semiconductor chit can be mounted and a fourth surface facing in the second direction, the third and fourth surfaces substantially coincident with the first and second reference planes, at least a part of the fourth surface being spaced from the second reference plane towards the first reference plane, wherein the support comprises a plurality of discrete projections which project in the second direction, wherein the support has a center and first and second of the discrete projections are spaced different distances from the center of the support.

47. The lead frame according to claim 41 wherein the support has an area within which a semiconductor chip is to be mounted and at least one of the discrete projections is located within the area.

48. The lead frame according to claim 43 wherein the support has an area within which a semiconductor chip is to be mounted and at least one of the discrete projections is located within the area.

49. The lead frame according to claim 45 wherein the support has an area within which a semiconductor chip is to be mounted and at least one of the discrete projections is located within the area.

50. The lead frame according to claim 46 wherein the support has an area within which a semiconductor chip is to be mounted and at least one of the discrete projections is located within the area.

* * * * *